(12) United States Patent
Kirchhoff

(10) Patent No.: US 7,078,313 B2
(45) Date of Patent: Jul. 18, 2006

(54) METHOD FOR FABRICATING AN INTEGRATED SEMICONDUCTOR CIRCUIT TO PREVENT FORMATION OF VOIDS

(75) Inventor: Markus Kirchhoff, Ottendorf-Okrilla (DE)

(73) Assignee: Infineon Technologies AG, Munich (DE)

( * ) Notice: Subject to any disclaimer, the term of this patent is extended or adjusted under 35 U.S.C. 154(b) by 552 days.

(21) Appl. No.: 10/237,543

(22) Filed: Sep. 9, 2002

(65) Prior Publication Data

US 2003/0054630 A1 Mar. 20, 2003

(30) Foreign Application Priority Data

Sep. 7, 2001 (DE) .............................. 101 43 997

(51) Int. Cl.
*H01L 21/76* (2006.01)

(52) U.S. Cl. .................. 438/425; 435/405; 435/410; 435/424; 435/434; 438/436; 438/442; 438/453; 438/702; 438/787

(58) Field of Classification Search ................ 438/405, 438/410, 424–425, 434, 436, 442, 453, 702, 438/787

See application file for complete search history.

(56) References Cited

U.S. PATENT DOCUMENTS

| 5,240,875 A | 8/1993 | Tsou |
| 5,960,300 A | 9/1999 | Yabu et al. |
| 6,015,759 A * | 1/2000 | Khan et al. .................. 438/707 |
| 6,057,209 A | 5/2000 | Gardner et al. |
| 6,118,167 A | 9/2000 | DiSimone et al. |
| 6,541,401 B1 * | 4/2003 | Herner et al. ................ 438/787 |

OTHER PUBLICATIONS

Wolf, Silicon Processing for the VLSI Era, vol. 2: Process Integration, Lattice Press 1990, pp. 196-198.*

* cited by examiner

*Primary Examiner*—Matthew Smith
*Assistant Examiner*—Thanh V. Pham
(74) *Attorney, Agent, or Firm*—Laurence A. Greenberg; Werner H. Stemer; Ralph E. Locher

(57) ABSTRACT

Recesses between gate layer stacks are filled with a first electrically insulating material. Cavities or voids are opened up during the removal of a portion of the first insulating material. These voids are filled during the application of a conductive layer and can then lead to short circuits. Inventively, a layer for closing up voids is produced before the conductive material is applied, as a result of growing a second electrically insulating material onto the surface of the remaining first insulating material. This second insulating layer closes up voids that have formed in the first insulating material so that they can no longer lead to short circuits. In particular, voids that are difficult to gain access to and open out into side walls of contact holes can in this way be closed up in a simple manner.

6 Claims, 4 Drawing Sheets

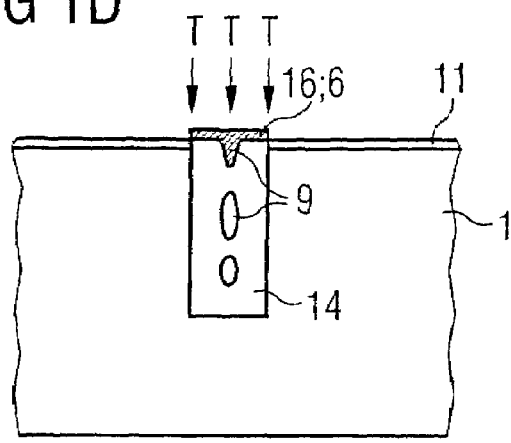
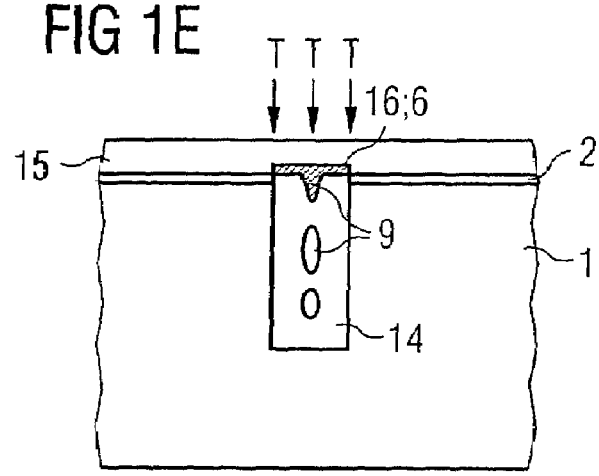
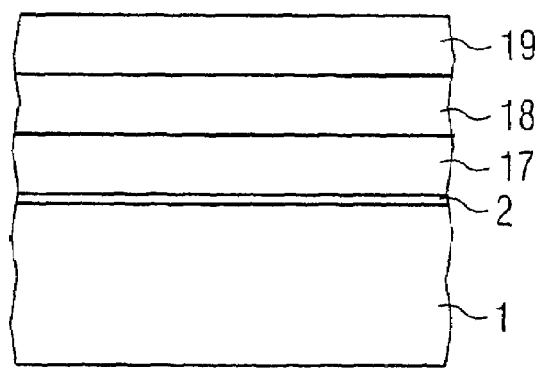

METHOD FOR FABRICATING AN INTEGRATED SEMICONDUCTOR CIRCUIT TO PREVENT FORMATION OF VOIDS

BACKGROUND OF THE INVENTION

Field of the Invention

The invention relates to a method for fabricating an integrated semiconductor circuit such that short circuits do not occur as a result of voids in recesses that are filled with an electrically conductive material.

In particular, the invention relates to a method for fabricating an integrated semiconductor circuit, which includes the following series of steps:
a) providing a semiconductor substrate;
b) forming a recess;
c) depositing a first electrically insulating material, so that the recess is filled;
d) partially removing the first insulating material; and
e) applying an electrically conductive material.

The invention also relates to a method for fabricating an integrated semiconductor circuit, which includes the following series of steps:
a) providing a semiconductor substrate and forming a gate layer sequence on the semiconductor substrate;
b) forming a recess in the gate layer sequence with the result that word lines are formed on both sides of the recess;
c) depositing a first electrically insulating material so that the recess is filled and the word lines are covered;
d) partially removing the first insulating material; and
e) applying an electrically conductive material.

Methods of this type are used in semiconductor manufacturing if isolation trenches (shallow trenches) are being manufactured in a semiconductor substrate or if word lines, which have been patterned from gate layer stacks, are being covered with an insulating material and in this way are being electrically insulated from one another. In both cases, a recess, namely a trench opening or a space between adjacent word lines, is filled with an electrically insulating material. The recesses are filled in such a manner that a material, for example, silicon oxide that is doped with boron and/or phosphorus, is deposited over the entire surface of the semiconductor substrate.

The insulating material that has been deposited is not desired everywhere and therefore portions of the insulating material have to be subsequently removed. For example, during the manufacturing of an isolation trench, after depositing the insulating material, this material is also present outside the trench opening, on the remaining semiconductor structures. In order to remove the insulating material from the remaining semiconductor structures, generally a chemical mechanical polishing operation is carried out.

In the case of covering word lines (i.e. gate structures), although it is generally desirable for the entire surface of the semiconductor substrate to be covered with the insulating material, since the gate structures will also be insulated at the top, contact holes to make contact with the semiconductor substrate have to be etched into the insulating layer which has been deposited, so that in this case also, portions of the insulating material have to be removed.

The etching operation that is used to remove portions of the insulating material always penetrates into the interior of the first insulating material. Cavities that are located in the interior of the insulating material can lead to problems if the electrically conductive material that is deposited on the partially etched insulating material penetrates into these cavities and causes short circuits in the finished semiconductor product.

Cavities are formed primarily during the filling of narrow but deep trenches. If the aspect ratio of a recess, i.e. the ratio of depth to width of the recess, exceeds a certain level, then cavities that are known as voids are formed during the subsequent filling of the recess by a conductive material, which is in particular a metal. These voids often cause short circuits. Although conditioning, which is usually carried out at temperatures between 700 and 900° C., and which is assisted by dopants, such as boron and phosphorus that is admixed with the insulating material, does liquefy the filling material (generally a silicate glass), with the result that the filling material flows into the voids, this does not reliably eliminate all of the voids, and consequently there continues to be a risk of short circuits.

Current attempts to eliminate short circuits caused by voids are directed toward further developing the deposition process for filling the recesses and/or the thermal aftertreatment of the filling material, in order either to prevent voids from forming or at least to subsequently remove the voids.

Thermal treatment (anneals) of this type cannot completely eliminate voids, in particular in recesses with high aspect ratios. In the case of shallow trench isolations, the limit for trenches which can be filled without voids is an aspect ratio of 3:1, while for a pre-metal dielectric which is deposited on gate structures and in the process has also to fill the spaces between adjacent gate structures, the maximum aspect ratio is 5:1, and in the case of dielectric of a metalization level, the maximum aspect ration is 2:1. In the case of deeper trenches, void-free filling is not ensured when conventional techniques are used.

SUMMARY OF THE INVENTION

It is accordingly an object of the invention to provide a method for fabricating an integrated semiconductor circuit which overcomes the above-mentioned disadvantages of the prior art methods of this general type.

In particular, it is an object of the invention to provide a method for fabricating an integrated semiconductor circuit, in which method, the formation of short circuits as a result of fillings that contain voids is prevented.

With the foregoing and other objects in view there is provided, in accordance with the invention, a method for fabricating an integrated semiconductor circuit, which includes steps of:
a) providing a semiconductor substrate;
b) forming a recess;
c) depositing a first electrically insulating material to fill the recess;
d) removing a portion of the first insulating material;
e) applying an electrically conductive material;
f) after step d) and before step e), producing a layer for closing up voids by growing a second electrically insulating material onto a surface of the first insulating material;
g) between steps a) and b), depositing an etching stop layer having a top side; and
h) in step d), polishing the first insulating material down to the top side of the etching stop layer by using a chemical mechanical polishing operation.

In the method described immediately above, the object is achieved by the fact that before the conductive material is applied, a layer for closing up voids is produced, as a result of growing a second electrically insulating material onto the surface of the remaining first insulating material. In addition, an etching stop layer is deposited between steps a) and b), and in step d), the first insulating material is polished back down to the top side of the etching stop layer by using a chemical mechanical polishing operation.

According to the invention, a second electrically insulating material is grown onto the first electrically insulating material with which the recess has been filled. As a result of this process step, the second electrically insulating material is on the one hand grown onto the surface of the first insulating material. On the other hand, however, if the surface of the first insulating material has voids that extend as far as this surface, the second electrically insulating material is also grown into the voids, during which process, the voids are closed up at least at the surface. The covering layer formed from the second insulating material therefore covers not only the surface of the first insulating material (of the filling material), but also closes up cavities which lead into the interior of the trench as a result of the growth closing up these cavities from their wall inward. This "sealing" of the surface of the first insulating material prevents voids from being filled during the subsequent deposition of conductive material, and thus prevents the possibility of short circuits.

According to the invention, in a deviation from the conventional attempts to avoid or eliminate voids in any event, the presence of some voids is taken as a given or at least is accepted as a likelihood. According to the invention, the conventional optimization of the deposition operation and/or of the thermal aftertreatment is replaced by sealing the remaining surface of the first insulating material as a result of growing on a second insulating layer. This deposition of an additional insulating layer, which closes up the voids, can also be used in addition to the conventional techniques, as a precautionary measure. The inventive method uses the fact that voids per se are not inherently detrimental, but rather only cause problems if they are filled with an electrical conductor, for example with a metal, which regularly occurs in conventional methods. Unlike conventional methods, however, the invention does not prevent the formation or presence of voids before the deposition of a metal, but rather merely prevents the metal from penetrating into the voids that are present. However, as a result it is possible to use deeper trenches as is customary for producing integrated semiconductor circuits without any risk of short circuits being present.

The layer of the second electrically insulating material need only be applied thinly, such that any voids at the surface of the first insulating material are closed up by a growth from the walls of the voids inward. Therefore, a small layer thickness of the second insulating material is sufficient to seal the filling of the recess at its surface. A layer thickness of the second insulating layer of the order of magnitude of half the diameter of the voids—or for safety's sake with a layer thickness which is up to two to four times greater—is sufficient to reliably close up the voids. With this small layer thickness, the layer of the second insulating material does not adversely affect the planarity of the semiconductor structure, and therefore portions of the second insulating material do not have to be removed.

If voids are formed in the interior of the deposited first insulating material and if these voids are opened up during the partial removal of the first insulating material in step d), it is provided that these voids are closed up by the growth of the second insulating material. As a result, the voids can no longer be filled with the conductive material and are therefore harmless.

According to the invention, it is provided that an etching stop layer is deposited between steps a) and b), and that in step d), the first insulating material is polished back down to the top side of the etching stop layer by using a chemical mechanical polishing operation. The insulating material that is deposited over the entire surface including on the remaining surface of the semiconductor structure, i.e. including outside of the trench opening for the shallow trench isolation, is generally etched back by using a CMP step (chemical mechanical polishing), until the original semiconductor structure appears again laterally outside the recesses. To ensure that the etching ends precisely at the original substrate surface, the etching stop layer is applied before the first insulating material is deposited. The recess is etched through this layer and extends even further into the substrate.

A preferred embodiment provides for a trench for a shallow trench isolation to be etched into the semiconductor substrate as the recess in step b). Shallow trench isolations are used to electrically insulate transistors, or other components that are arranged adjacently on the substrate surface, from one another. The trenches are filled with an insulating material, during which process voids may form. If the first insulating material, which is inevitably deposited over the entire surface, is removed outside the trench for the shallow trench isolation, voids can be opened up. Since in a subsequent method stage, word lines are formed on the semiconductor substrate, leading over the substrate surface to the gate electrodes of transistors, these word lines inevitably cross the trench isolations situated in the semiconductor substrate at some locations. Two word lines that run adjacent to one another over the same isolation trench may be short-circuited by voids that are present in the trench isolation and that are filled during the deposition of the lowermost conductive layer (generally polysilicon) of the word line. The top sides of the trench fillings are sealed and the voids closed up by the inventive method.

With the foregoing and other objects in view there is provided, in accordance with the invention, a method for fabricating an integrated semiconductor circuit, which includes steps of:

a) providing a semiconductor substrate and forming a gate layer sequence on the semiconductor substrate;
b) forming a recess in the gate layer sequence such that word lines are formed on both sides of the recess;
c) depositing a first electrically insulating material to fill the recess and cover the word lines;
d) removing a portion of the first insulating material;
e) applying an electrically conductive material; and
f) before step e), producing a layer for closing up voids by growing a second electrically insulating material onto a surface of the first insulating material.

According to this second method, the recess is etched into a gate layer sequence on the semiconductor substrate, with word lines being formed on both sides of the recess, and in step c), the first insulating material is deposited with a layer thickness that is large enough so that the word lines are also covered. Word lines for connecting to the gate electrodes of MOSFET transistors (metal oxide semiconductor field-effect transistors) typically include a lower polysilicon layer, a middle metallic layer of tungsten, for example, and an upper hard-mask layer including a nitride, for example. After this layer sequence has been deposited, the layer stack is patterned, and the word lines and the spaces between them, i.e. recesses, are formed at the same time. Then, this structure is covered with silicon nitride and BPSG (boro phospho silicate glass), on which an oxide is then deposited, and into which the lowermost metalization level is introduced. Therefore, in step c), a space between adjacent word lines is filled with the first insulating material. The filling of a space of this type directly on the semiconductor substrate or on its gate oxide layer is used not only to insulate adjacent word lines with respect to one another, but also to compensate for topography-related height differences on the semiconductor substrate before the first metalization level is fabricated.

Preferably, in step d) a contact hole is etched into the first insulating material, leading between adjacent word lines to the semiconductor substrate, and the second insulating material is grown onto side walls of the contact hole, which consists of the first insulating material.

The contact-hole etching is required in order to make contact with the doped regions in the semiconductor substrate through the layer of the first insulating material that covers the word lines. The etching of contact holes causes a particularly substantial problem since during this etching, which goes into the body of the filling material, voids are regularly opened up. Particularly in the case of word lines that are closely adjacent in the lateral direction, voids often connect adjacent contact holes to one another. Voids that start from contact holes (vias) and are filled with a metal can therefore cause short circuits. However, the inventive method allows the surfaces of voids that have been etched open, to be closed up within the contact hole openings, in particular, in the side walls of contact hole openings to which it is difficult to gain access.

The second insulating material can be subsequently removed from the base of the contact hole after it has been grown on by using an anisotropic etch, for example, when the gate oxide layer is also being etched, in order to make contact with the semiconductor substrate. The contact-hole etching generally uncovers materials situated below the first insulating material, on which growth of the second insulating material can take place. In this case, the second insulating material has to be removed from the base of the contact hole opening, in order to make contact with the semiconductor substrate. An anisotropic etching process is used for this purpose; on account of its anisotropy, this process does not attack the side walls of the contact hole, so that there, the closed voids remain closed.

However, a preferred refinement of the invention provides for a barrier layer of a material that inhibits the growth of a second insulating material to be deposited on the word lines and in the recess between the word lines. This deposition is performed between steps b) and c). In addition, in step d), the first insulating material is etched selectively with respect to the barrier layer in the region of the contact hole, and the barrier layer at the base of the contact hole is removed after the growth of the second insulating material. It is advantageous to end the contact hole etching on or in the barrier layer first of all, since during the selective growth of the second insulating material in step d), the nitride layer prevents the contact hole base from being covered. If the side walls of the contact hole are covered with the second insulating material, it is only necessary for the nitride layer at the base of the contact hole to be etched, without having to remove the previously deposited first insulating material at the base.

Finally, in step e), the contact hole is filled with a metal, and the second insulating material on the side walls of the contact hole prevents the metal from penetrating into voids in the first insulating material. Metallic contact-hole fillings, for example, of tungsten can therefore no longer short-circuit adjacent contact holes in the same space between word lines.

Silicate glass doped with boron and/or phosphorus is preferably deposited as a first insulating material. The doping promotes the flow of the glass at lower temperatures than without doping, and thus facilitates the expulsion of voids during a thermal anneal.

The second insulating material is preferably grown on by using a selective growth process. In particular, silicon oxide can be grown on as a second insulating material. According to a particularly preferred embodiment of the method, the silicon oxide is grown onto the first insulating material by using a SELOX process, which promotes growth on oxide-containing surfaces and inhibits growth on nitride-containing, oxynitride-containing, or metallic surfaces. The SELOX process is known per se and is conventionally used only to introduce complete fillings into recesses. It ensures rapid growth on oxide (in particular silicon oxide, or if boron and/or phosphorus doping has been introduced, on BSG, PSG or BPSG) and a high selectivity with respect to other materials. In the above embodiment, the SELOX process is used to cover only the surface of a filling with a layer of another material, and thus seal this surface. The deposition of a very small layer thickness of silicon oxide by using the SELOX process means that the topography of the surface of the semiconductor structure is retained. In the fabrication of shallow trench isolations, the method therefore leads to the selective growth of the second insulating material on the first, with the result that regions of the semiconductor structure that lie outside the trench filling are not covered with the second insulating material. By contrast, in the case of covering word lines, the method leads to covering only the side walls with the second insulating material, but not the contact hole bases that are covered with a barrier layer. In a SELOX process which is used to deposit silicon oxide, this deposition takes place selectively with respect to nitride layers, for example, silicon nitride or titanium nitride.

Finally, the second insulating material is thermally compacted by conditioning. The second electrically insulating material, which has been deposited with only a small layer thickness, can in this way protect the covered surfaces from penetration into covered void openings even more effectively.

Other features which are considered as characteristic for the invention are set forth in the appended claims.

Although the invention is illustrated and described herein as embodied in a method for fabricating an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A to 1E show method based on a shallow trench; and

FIGS. 2A to 2F show a method based on a contact hole.

DESCRIPTION OF THE PREFERRED EMBODIMENTS

Figure 1A:
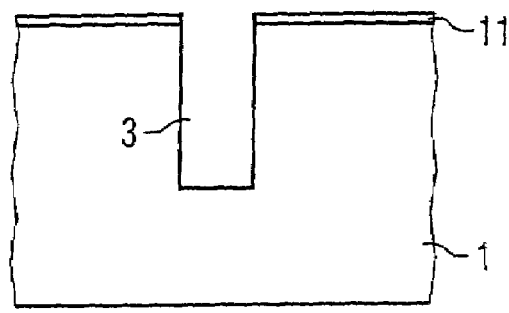
Figure 1B:
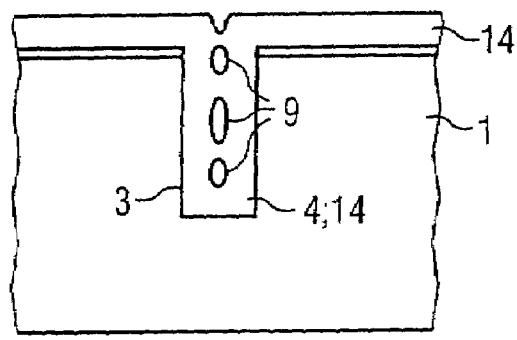
Figure 1C:
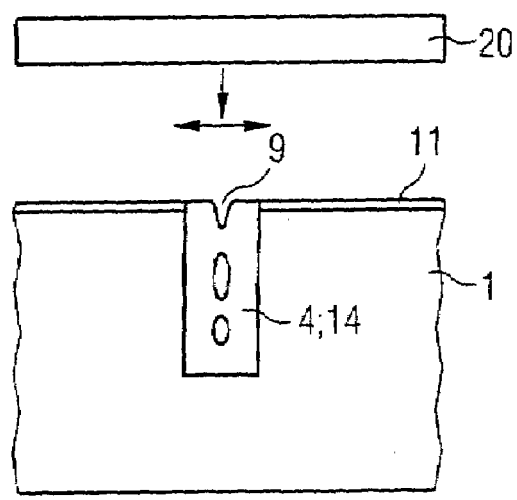

Referring now to the figures of the drawing in detail and first, particularly, to FIG. 1A thereof, there is shown a semiconductor structure including a semiconductor substrate 1 with a trench opening 3 for a shallow trench. To fabricate the structure illustrated in FIG. 1A, the semiconductor substrate 1 is provided with a thin oxide layer and/or pad nitride layer 11. The pad nitride layer serves as a polishing stop layer in a subsequent method step. Then, a trench opening 3 for a shallow trench is etched, resulting in the formation of the semiconductor structure illustrated in FIG. 1A. FIG. 1B shows that when deep trenches with a high aspect ratio are filled, cavities, known as voids 9, which are generally arranged in the center of the cross section of the trench filling, can form in the interior of the trench filling. These voids 9 are formed during the deposition of the layer 4 that fills the trench. The layer 4 generally consists of an insulating material 14. These voids 9 also cannot be completely eliminated by liquefying the insulating material 14 at high temperatures. If the layer 4, which is initially deposited on the entire substrate surface, is removed at the surface, as shown in FIG. 1C, by using a chemical mechanical polishing operation in which a polishing pad 20 grinds down the layer 4 as far as the pad nitride layer 11, then some of these voids 9 will be opened up. Since these voids 9 often extend over relatively great distances in a trench, they can lead to short circuits, for example, if a conductive material 15 is deposited on the structure illustrated in FIG. 1C and this material fills up voids which are open at the surface.

All conventional efforts have been aimed at either precluding the formation of voids from the outset or eliminating this formation of voids before the conductive material is deposited. However, these efforts have not been completely successful.

According to the invention, as illustrated in FIG. 1D, a second electrically insulating material 16 is grown onto the first electrically insulating material 14, with the result that a new surface is formed on the first insulating material 14, and this new surface is free of voids. The second insulating material 16 covers the surface of the first insulating material 14 and also voids 9 which have been opened up by polishing and open out into this surface. These voids are closed up by the second electrically insulating material and therefore can no longer be filled with the conductive material.

The deposition of the second electrically insulating material 16 preferably takes place selectively. For example, in FIG. 1D no material 16 is grown onto the pad nitride layer 11. Consequently, a further planarization operation is not required. This further planarization operation would open up voids that have previously been closed up. BPSG is preferably used as the first electrically insulating material 14; on account of its doping, it can be liquefied relatively easily, in order for voids that are present to be at least partially expelled again. Silicon oxide is preferably grown on as the second material.

The second material 16, which is grown onto the first insulating material 14, can be thermally compacted by a subsequent conditioning step T, in order to achieve even better sealing of the surface of the trench filling 14.

The method illustrated in FIGS. 1A to 1E can be used to produce-shallow trenches 3 which are used for the electrical isolation of adjacent semiconductor structures on the substrate surface.

Finally, an electrically conductive material 15 is deposited on the semiconductor structure that has been covered with the second electrically insulating material 16 that was grown on using the inventive method, as illustrated in FIG. 1E. In the process, the new, void-free surface that has been formed by the second electrically insulating material 16 prevents the conductive material 15 from penetrating into the voids 9 in the first insulating material 14 that were opened up by polishing.

The invention is furthermore suitable for producing and sealing a dielectric that has been deposited directly on and between gate layer stacks. In particular, inner walls of contact holes that have been etched into a dielectric can be sealed using the inventive method.

Figure 2B:
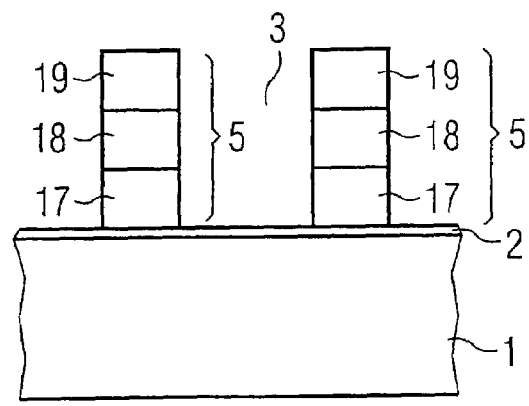

As shown in FIG. 2A, a plurality of layers including polysilicon 17, tungsten silicide 18 and a silicon nitride 19 are deposited on the gate oxide layer 2 of a semiconductor substrate 1. The silicon nitride layer serves as a hard-mask layer for patterning word lines 5. This layer sequence corresponds to a typical gate layer structure. The layers 17, 18, 19 are then patterned, so that the structure illustrated in FIG. 2B is formed.

Figure 2C:
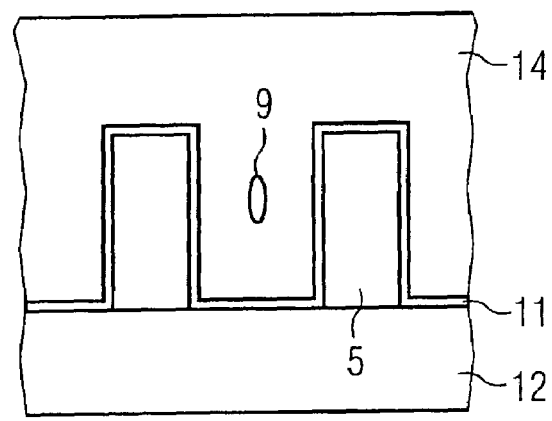

On the gate oxide layer 2 of the semiconductor substrate 1, FIG. 2B shows two adjacent word lines 5 which consist of the layers 17, 18 and 19. Between adjacent word lines 5 there is a recess 3 which is filled with a first insulating material 14 up to above the height of the word lines 5, as illustrated in FIG. 2C. A thin silicon nitride layer 11 was deposited on the structure obtained in this way, and then the material 14, which is typically BPSG, is applied to this thin silicon nitride layer 11. The material 14 is used to fill the recesses 3 between the gate layer stacks. On account of the high aspect ratio of the recesses 3, voids 9 are often formed, and as illustrated in FIG. 2E, these voids 9 may extend over great distances in the center of the cross section of the recesses 3, parallel to the word lines 5. To eliminate the voids 9 as much as possible, the structure is subjected to a heat treatment after the BPSG layer 14 has been deposited.

Figure 2D:
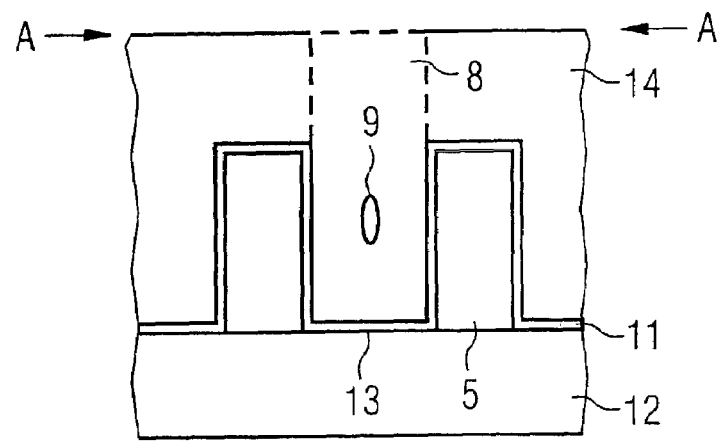
Figure 2E:
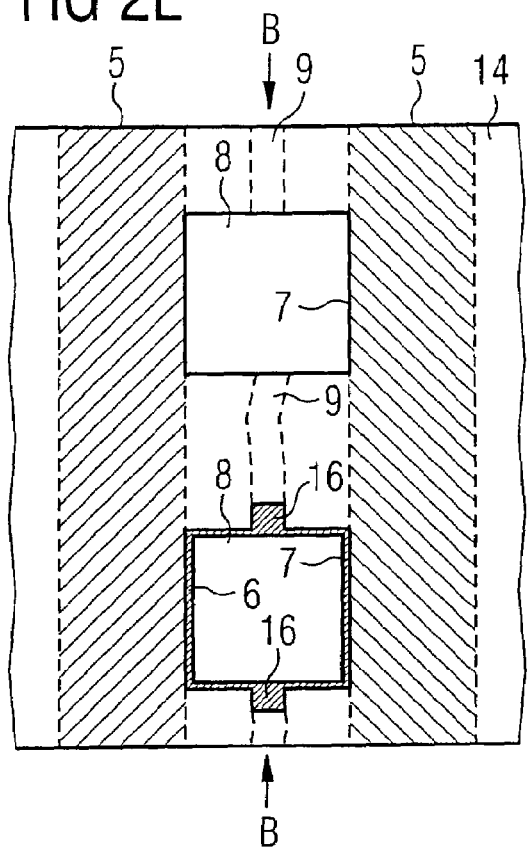

In accordance with FIG. 2D, contact holes 8 are etched into the deposited dielectric 14 and then open up the voids 9, which run in channel form, in regions. In particular, if there are a plurality of contact holes 8 at a certain distance from one another between two word lines 5, the voids can be short-circuited if a metallic filling 15 is deposited in the contact hole openings 8, and the metallic filling 15 penetrates into the passages of the voids 9 running parallel to the word lines 5.

FIG. 2E illustrates a plan view, from above, looking at the section plane A—A of the semiconductor structure illustrated in FIG. 2D. Between the word lines 5, which run vertically in FIG. 2E, which are located below the section plane, and which are therefore shown in dashed lines, there are two contact hole openings 8. The two contact hole openings 8 have been etched into the surface of the semiconductor structure and extend as far as the base of the recesses 3, i.e. as far as the underside of the first electrically insulating material 14. These contact holes can be used to make contact with the semiconductor substrate 1. On account of the formation of voids 9, which may extend over great distances parallel to the word lines 5 in the interior of the recess 3, the side walls 7 of the contact holes 8 are partially interrupted. If the contact hole openings 8 are filled with an electrically conductive material 15, this material can creep through the voids 9 to the closest contact hole 8 and thus cause short circuits in the integrated semiconductor circuit. To prevent this, according to the invention, as illustrated in FIG. 2E on the basis of the lower contact hole 8, the first electrically insulating material 14 is covered with a second electrically insulating material 16 by a selective growth process. The second electrically insulating material 16 covers the surface of the semiconductor structure illustrated in FIG. 2D outside the contact hole openings 8, and also covers the side walls 7 in the interior of the contact holes, as illustrated with reference to the lower contact hole 8. In the process, voids 9 which open out in the side walls 7 are also closed up at the surface, since the second electrically insulating material 16 is also grown on the inner wall of the voids 9 and closes up these voids at least in the vicinity of the side walls 7. As a result, the voids 9 are sealed and can no longer be filled with an electrically conductive material.

Figure 2F:
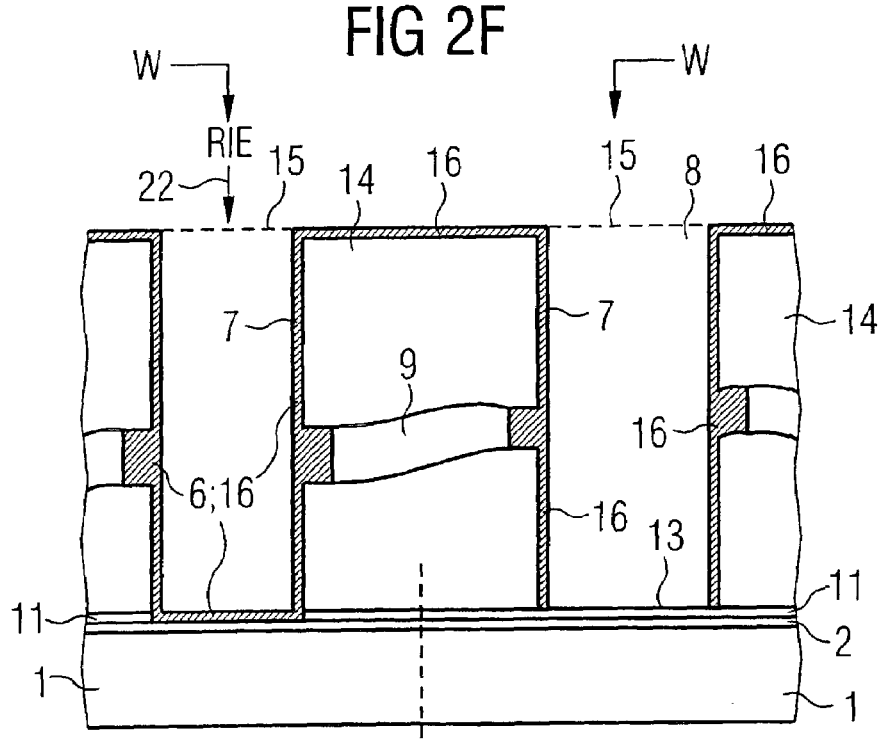

The view taken through the section line B—B, running through the semiconductor structure illustrated in FIG. 2E, is additionally illustrated in FIG. 2F. In this perspective, the word lines 5 run from the left to the right in front of and behind the plane of the drawing. Between them is the section illustrated through the recess 3 into which the first material 14 has been deposited. Two contact hole openings 8 have subsequently been etched into the material 14. The contact holes 8 extend as far as the next layer down, for example as far as the gate oxide 2 or as far as the surface of a semiconductor substrate 1.

According to the invention, the second insulating material 16 is deposited on the surfaces of the semiconductor structure, which is formed by the first insulating material 14, so that the upper side of the covering layer 14 and also the side walls 7 of the contact holes 8 are covered with the second conductive material 16 and sealed. In particular, the voids which are formed between adjacent contact holes 8 are closed off at the surface from the side wall 7 of the corresponding contact hole 8.

FIG. 2F shows two different alternate embodiments with regard to the etching of the contact hole 8. The left-hand half of FIG. 2F illustrates a nitride layer 11, which has also been etched, i.e. removed, during the contact hole etching. The gate oxide 2 below it then forms the base of the contact hole. If the growth process of the second insulating material 16 is not selective with respect to the material 2 at the base of the contact hole 8, the second electrically insulating material 16 is likewise deposited there. Therefore, it then additionally has to be removed by means of an anisotropic etch, which is indicated by the arrow 22 and is carried out, for example, by using a RIE (reactive ion etching) process, in order then to allow for the introduction of the metallic contact hole filling, for example, tungsten. The contact hole filling fills the contact hole opening as far as the line 15 indicated in dashed form.

In another, more advantageous embodiment, which is illustrated on the right-hand side of FIG. 2F, the nitride layer 11 is not initially removed during the contact hole etching. During the subsequent selective deposition of the second insulating material 16, the selectivity of this deposition process is also utilized at the base of the contact hole 8, with the result that the layer of the second insulating material 16 is formed only at the side walls 7 and not at the base of the contact hole 8. Consequently, only the barrier layer 11 and the gate oxide 2 then have to be etched in order to make contact with the semiconductor substrate 1 through the contact hole filling 15. In this embodiment, there is no additional layer of the material 16, which would also have to be removed, formed at the base of the contact hole 8.

The selective growth of the second insulating material 16 preferably takes place using a SELOX process, a selective silicon oxide deposition process that enables silicon oxide to be deposited on base layers, which contain silicon oxide, selectively with respect to silicon nitride, titanium nitride or metals, for example. The SELOX process is suitable, in particular, for deposition on BPSG, i.e. doped silicon oxide. By contrast, the second insulating material 16, i.e. silicon oxide, is practically not deposited on nitride layers.

The SELOX process is known per se and is carried out in a SACVD (sub-atmospheric chemical vapor deposition) chamber at 20 to 760 Torr. At temperatures of between 400 and 600° C., a gas mixture of ozone and TEOS (tetraethyl orthosilicate) with a mixing ratio of at least 5:1 is deposited. The deposition process is isotropic and leads to conformal deposition. According to the invention, the SELOX process is used for providing an exclusively external coverage of a trench filling that has already been introduced. The SELOX oxide produced can be compacted by a subsequent heat treatment.

A HDP-CVD (high density plasma CVD) process, which is carried out at atmospheric pressures of between 1 and 10 mTorr and a plasma density of approximately $10^{11}$ electrons/cm$^3$, is particularly suitable for applying the first insulating material 14, generally BPSG.

Furthermore, it is possible to use deposition processes which are currently customary, such as APCVD (atmospheric pressure), SACVD (sub-atmospheric pressure), and PECVD (plasma enhanced CVD), in which case, on account of the inventive sealing of layers that have been deposited and etched back, even deposition processes for the deposition of the first electrically insulating material, which have tended to lead to the formation of voids, can be used in a much more versatile way, since the inventive sealing of voids which are opened up by polishing eliminates short circuits.

I claim:

1. A method for fabricating an integrated semiconductor circuit, which comprises:
   a) providing a semiconductor substrate;
   b) depositing an etching stop layer having a top side;
   c) forming a recess;
   d) depositing a first electrically insulating material to fill the recess;
   e) removing a portion of the first insulating material by polishing the first insulating material down to the top side of the etching stop layer by using a chemical mechanical polishing operation;
   f) applying an electrically conductive material; and
   g) after step e) and before step f), producing a layer for closing up voids by growing a second electrically insulating material onto a surface of the first insulating material by a selective growth process performed selectively to the etching stop layer.

2. The method according to claim 1, wherein: step b) includes forming the recess by etching a trench, which is for a shallow trench isolation, into the semiconductor substrate.

3. The method according to claim 1, wherein:
   the voids are formed in the interior of the first insulating material;
   the voids are opened up when step e) is performed; and
   the voids are closed by the second insulating material.

4. The method according to claim 1, wherein: the first insulating material is a silicate glass that is doped with a material selected from a group consisting of boron and phosphorus.

5. The method according to claim 1, wherein: the second insulating material is silicon oxide.

6. The method according to claim 1, wherein: the second insulating material is thermally compacted by conditioning.

* * * * *